(12) United States Patent
Adel et al.

(10) Patent No.: US 11,874,605 B2
(45) Date of Patent: Jan. 16, 2024

(54) VERIFICATION METROLOGY TARGETS AND THEIR DESIGN

(71) Applicant: KLA Corporation, Milpitas, CA (US)

(72) Inventors: Michael E. Adel, Ya'akov (IL); Inna Tarshish-Shapir, Yokneam Ilit (IL); Shiming Wei, Shanghai (CN); Mark Ghinovker, Yoqneam Ilit (IL)

(73) Assignee: KLA Corporation, Milpitas, CA (US)

( * ) Notice: Subject to any disclaimer, the term of this patent is extended or adjusted under 35 U.S.C. 154(b) by 3 days.

(21) Appl. No.: 16/921,880

(22) Filed: Jul. 6, 2020

(65) Prior Publication Data

US 2020/0348604 A1    Nov. 5, 2020

Related U.S. Application Data

(63) Continuation of application No. 15/351,995, filed on Nov. 15, 2016, now Pat. No. 10,705,434, which is a (Continued)

(51) Int. Cl.
*H01L 21/66* (2006.01)
*G03F 7/00* (2006.01)
*G06F 30/00* (2020.01)

(52) U.S. Cl.
CPC ...... *G03F 7/70491* (2013.01); *G03F 7/70616* (2013.01); *G06F 30/00* (2020.01); *H01L 22/30* (2013.01)

(58) Field of Classification Search
CPC .. G03F 7/70491; G03F 7/70616; G06F 30/00; H01L 22/30
See application file for complete search history.

(56) References Cited

U.S. PATENT DOCUMENTS

| 5,608,526 A | 3/1997 | Piwonka-Corle et al. |
| 5,859,424 A | 1/1999 | Norton et al. |

(Continued)

FOREIGN PATENT DOCUMENTS

| CN | 101727014 A | 6/2010 |
| CN | 102057330 A | 5/2011 |
| CN | 103582819 A | 2/2014 |

OTHER PUBLICATIONS

U.S. Appl. No. 61/738,760, filed Dec. 18, 2012, entitled Method for Integrated Use of Model-Based Metrology an a Process Model.
(Continued)

*Primary Examiner* — Nghia M Doan
(74) *Attorney, Agent, or Firm* — Suiter Swantz pc llo

(57) ABSTRACT

Metrology target design methods and verification targets are provided. Methods comprise using OCD data related to designed metrology target(s) as an estimation of a discrepancy between a target model and a corresponding actual target on a wafer, and adjusting a metrology target design model to compensate for the estimated discrepancy. The dedicated verification targets may comprise overlay target features and be size optimized to be measureable by an OCD sensor, to enable compensation for inaccuracies resulting from production process variation. Methods also comprise modifications to workflows between manufacturers and metrology vendors which provide enable higher fidelity metrology target design models and ultimately higher accuracy of metrology measurements.

19 Claims, 5 Drawing Sheets

Related U.S. Application Data continuation of application No. PCT/US2015/053838, filed on Oct. 2, 2015.

(60) Provisional application No. 62/059,640, filed on Oct. 3, 2014.

(56) References Cited

U.S. PATENT DOCUMENTS

| | | | |
|---|---|---|---|
| 5,859,525 A | 1/1999 | Minks | |
| 6,093,640 A * | 7/2000 | Hsu | G03F 9/7084 |
| | | | 257/E21.546 |
| 6,429,943 B1 | 8/2002 | Opsal et al. | |
| 6,869,739 B1 * | 3/2005 | Ausschnitt | G03F 7/70666 |
| | | | 430/30 |
| 6,985,610 B2 | 1/2006 | Suchard et al. | |
| 6,985,618 B2 | 1/2006 | Adel | |
| 7,346,878 B1 | 3/2008 | Cohen et al. | |
| 7,478,019 B2 | 1/2009 | Zangooie et al. | |
| 7,561,282 B1 | 7/2009 | Widmann | |
| 7,608,468 B1 * | 10/2009 | Ghinovker | G06F 30/39 |
| | | | 702/172 |
| 7,804,994 B2 | 9/2010 | Adel | |
| 7,933,026 B2 | 4/2011 | Opsal et al. | |
| 8,214,771 B2 | 7/2012 | Adel et al. | |
| 8,930,156 B2 | 1/2015 | Adel et al. | |
| 9,291,554 B2 | 3/2016 | Kuznetsov et al. | |
| 9,347,872 B1 * | 5/2016 | Poslavsky | G01N 21/211 |
| 9,360,768 B2 | 6/2016 | Bottiglieri | |
| 9,581,430 B2 | 2/2017 | Manassen et al. | |
| 9,915,522 B1 | 3/2018 | Jiang et al. | |
| 2003/0021465 A1 | 1/2003 | Adel et al. | |
| 2005/0273753 A1 | 12/2005 | Sezginer | |
| 2012/0330592 A1 | 12/2012 | Bottiglieri et al. | |
| 2013/0042089 A1 | 2/2013 | Vinh et al. | |
| 2013/0054186 A1 | 2/2013 | Den Boef | |
| 2013/0073070 A1 * | 3/2013 | Tsai | G01N 21/47 |
| | | | 700/103 |
| 2014/0153002 A1 | 6/2014 | Park et al. | |
| 2014/0172394 A1 | 6/2014 | Kuznetsov et al. | |
| 2014/0222380 A1 | 8/2014 | Kuznetsov et al. | |
| 2014/0257734 A1 | 9/2014 | Bringoltz et al. | |
| 2015/0043803 A1 | 2/2015 | Jeong | |
| 2016/0003609 A1 | 1/2016 | Shchegrov | |
| 2016/0196379 A1 * | 7/2016 | Adel | H01L 22/30 |
| | | | 716/55 |

OTHER PUBLICATIONS

U.S. Appl. No. 61/745,981, filed Dec. 26, 2012, entitled Side-by-Side Scatterometry Overlay.

U.S. Appl. No. 61/830,536, filed Feb. 5, 2013, entitled Method of Electromagnetic Modeling of Finite Structures and Finite Illumination of Metrology and Inspection.

U.S. Appl. No. 61/761,146, filed Feb. 5, 2013, entitled Method of Electromagnetic Modeling of Finite Structures and Finite Illumination of Metrology and Inspection.

Office Action in Korean Application No. 10-2017-7011780 dated Jun. 22, 2022, 20 pages (with English Translation).

Chinese Patent Office, Office Action received in Chinese Patent Application No. 202011201964.4, dated Jul. 21, 2023, 18 pages (including translation).

* cited by examiner

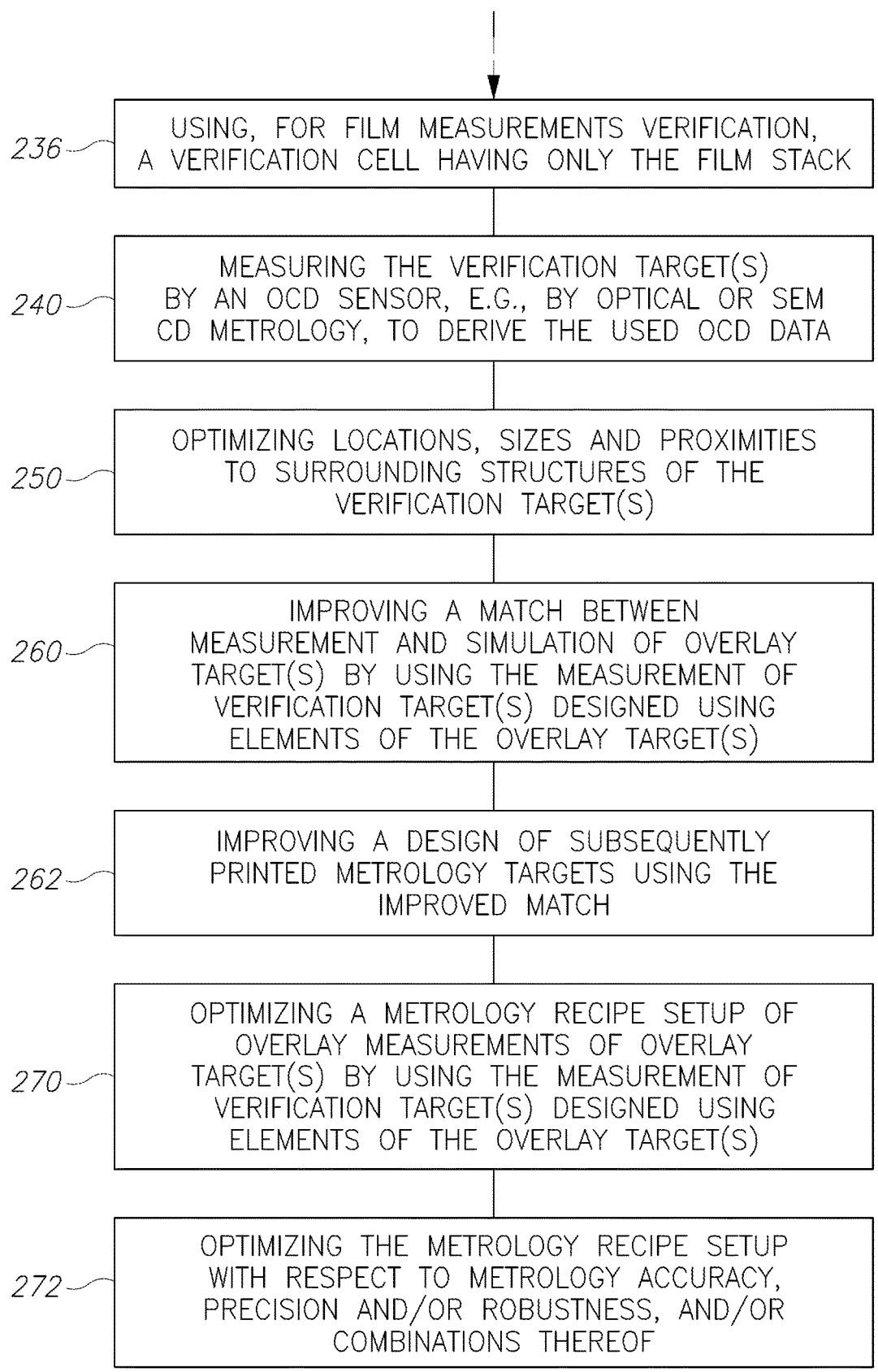
Figure 4 (cont. 1)

VERIFICATION METROLOGY TARGETS AND THEIR DESIGN

CROSS REFERENCE TO RELATED APPLICATIONS

The present application is a continuation application of and claims priority to U.S. patent application Ser. No. 15/351,995, filed on Nov. 15, 2016, which claims priority to PCT/US2015/053838, filed on Oct. 2, 2015, which claims the benefit of U.S. Provisional Patent Application No. 62/059,640 filed on Oct. 3, 2014, whereby each of the patent applications listed above are incorporated herein by reference in their entirety.

BACKGROUND OF THE INVENTION

1. Technical Field

The present invention relates to the field of semiconductor metrology, and more particularly, to metrology target design.

2. Discussion of Related Art

In the field of semiconductor metrology, a metrology tool may comprise an illumination system which illuminates a target, a collection system which captures relevant information provided by the illumination system's interaction (or lack thereof) with a target, device or feature, and a processing system which analyzes the information collected using one or more algorithms. Metrology tools can be used to measure structural and material characteristics (e.g., material composition, dimensional characteristics of structures and films such as film thickness and/or critical dimensions of structures, overlay, etc.) associated with various semiconductor fabrication processes. These measurements are used to facilitate process controls and/or yield efficiencies in the manufacture of semiconductor dies. Metrology tools may include one or more hardware configurations which may be used in conjunction with certain embodiments of this invention to, e.g., measure the various aforementioned semiconductor structural and material characteristics. Examples of such hardware configurations include the following: a spectroscopic ellipsometer (SE), a SE with multiple angles of illumination, a SE measuring Mueller matrix elements (e.g., using rotating compensator(s)), a single-wavelength ellipsometers, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, any imaging system, a pupil imaging system, a spectral imaging system, a scatterometer (e.g., speckle analyzer) etc.

The hardware configurations can be separated into discrete operational systems. On the other hand, one or more hardware configurations can be combined into a single tool. One example of such a combination of multiple hardware configurations into a single tool is provided by U.S. Pat. No. 7,933,026 (including e.g., a broadband SE, a SE with rotating compensator, a beam profile ellipsometer, a beam profile reflectometer, a broadband reflective spectrometer, and a deep ultra-violet reflective spectrometer) which is incorporated herein by reference in its entirety. In addition, there are typically numerous optical elements in such systems, including certain lenses, collimators, mirrors, quarter-wave plates, polarizers, detectors, cameras, apertures, and/or light sources. The wavelengths for optical systems can vary from about 120 nm to 3 microns. For non-ellipsometer systems, signals collected can be polarization-resolved or unpolarized. Multiple metrology heads may be integrated on the same tool, however, in many cases, multiple metrology tools are used for measurements on a single or multiple metrology targets, as described e.g., in U.S. Pat. No. 7,478,019, which is incorporated herein by reference in its entirety.

The illumination system of the certain hardware configurations includes one or more light sources. The light source may generate light having only one wavelength (i.e., monochromatic light), light having a number of discrete wavelengths (i.e., polychromatic light), light having multiple wavelengths (i.e., broadband light) and/or light that sweeps through wavelengths, either continuously or hopping between wavelengths (i.e., tunable sources or swept source). Examples of suitable light sources are: a white light source, an ultraviolet (UV) laser, an arc lamp or an electrode-less lamp, a laser sustained plasma (LSP) source, a supercontinuum source (such as a broadband laser source), or shorter-wavelength sources such as x-ray sources, extreme UV sources, or some combination thereof. The light source may also be configured to provide light having sufficient brightness, which in some cases may be a brightness greater than about 1 W/(nm cm$^2$ Sr). The metrology system may also include a fast feedback to the light source for stabilizing its power and wavelength. Output of the light source can be delivered via free-space propagation, or in some cases delivered via optical fiber or light guide of any type.

The metrology targets may possess various spatial characteristics and are typically constructed of one or more cells which may include features in one or more layers which may have been printed in one or more lithographically distinct exposures. The targets or the cells may possess various symmetries such as two fold or four fold rotation symmetry, reflection symmetry, as described e.g., in U.S. Pat. No. 6,985,618, which is incorporated herein by reference in its entirety. Different cells or combinations of cells may belong to distinct layers or exposure steps. The individual cells may comprise either isolated non-periodic features or alternately they may be constructed from one, two or three dimensional periodic structures or combinations of non-periodic and periodic structures as e.g., in U.S. Patent Publication No. 2013/042089, which is incorporated herein by reference in its entirety. The periodic structures may be non-segmented or they may be constructed from finely segmented features which may at or close to the minimum design rule of the lithographic process used to print them. The metrology targets may also be collocated or in close proximity with dummification structures in the same layer or in a layer above, below or in between the layers of the metrology structures. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself. Multiple targets may be measured (at the same time or at differing times) by the same or multiple metrology tools as described e.g., in U.S. Pat. No. 7,478,019, which is incorporated herein by reference in its entirety. The data from such measurements may be combined. Data from the metrology tool is used in the semiconductor manufacturing process for example to feed-forward, feed-backward and/or feed-sideways corrections to the process (e.g., lithography, etch), see e.g., U.S. Pat. No. 8,930,156, which is incorporated herein by reference in its entirety, disclosing feed forward methods for reusing metrology target cells; and therefore, might yield a complete process control solution. The metrology tools are designed to make many different types of measurements related to semiconductor manufacturing, for example measure characteristics of one or more targets, such as critical dimensions, overlay, sidewall angles, film thicknesses, process-related parameters (e.g., focus and/or dose). The targets can include certain regions of interest that are periodic in nature, such as for example gratings in a memory die.

As semiconductor device pattern dimensions continue to shrink, smaller metrology targets are often required. Furthermore, the measurement accuracy and matching to actual device characteristics increase the need for device-like targets as well as in-die and even on-device measurements. Various metrology implementations have been proposed to achieve that goal. For example, focused beam ellipsometry based on primarily reflective optics is described e.g., in U.S. Pat. No. 5,608,526, which is incorporated herein by reference in its entirety. Apodizers can be used to mitigate the effects of optical diffraction causing the spread of the illumination spot beyond the size defined by geometric optics, as described e.g., in U.S. Pat. No. 5,859,424, which is incorporated herein by reference in its entirety. The use of high-numerical-aperture tools with simultaneous multiple angle-of-incidence illumination is another way to achieve small-target capability, as described e.g., in U.S. Pat. No. 6,429,943 which is incorporated herein by reference in its entirety. Other measurement examples may include measuring the composition of one or more layers of the semiconductor stack, measuring certain defects on (or within) the wafer, and measuring the amount of photolithographic radiation exposed to the wafer. In some cases, metrology tool and algorithm may be configured for measuring non-periodic targets, as described e.g., in U.S. patent application Ser. No. 14/294,540 and in U.S. Patent Publication No. 2014/0222380, which are incorporated herein by reference in their entirety.

Measurement of parameters of interest usually involves a number of algorithms, carried out by corresponding analysis units in the respective metrology tools. For example, optical interaction of the incident beam with the sample is modeled using EM (electro-magnetic) solver and uses such algorithms as RCWA (Rigorous Coupled Wave Analysis), FEM (finite element method), method of moments, surface integral method, volume integral method, FDTD (Finite Difference Time Domain), and others. The target of interest is usually modeled (parametrized) using a geometric engine, or in some cases, process modeling engine or a combination of both. The use of process modeling is described e.g., in U.S. Patent Publication No. 2014/0172394, which is incorporated herein by reference in its entirety. A geometric engine is implemented, for example, in AcuShape software product of KLA-Tencor.

Collected data can be analyzed by a number of data fitting and optimization techniques an technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others. Collected data can also be analyzed by algorithms that do not include modeling, optimization and/or fitting modeling as described e.g., in U.S. Patent Publication No. 2014/0257734, which is incorporated herein by reference in its entirety. Computational algorithms are usually optimized for metrology applications with one or more approaches being used such as design and implementation of computational hardware, parallelization, distribution of computation, load-balancing, multi-service support, dynamic load optimization, etc. Different implementations of algorithms can be done in firmware, software, FPGA (Field Programmable Gate Array), programmable optics components, etc. The data analysis and fitting steps usually pursue one or more of the following goals: Measurement of CD, SWA, shape, stress, composition, films, bandgap, electrical properties, focus/dose, overlay, generating process parameters (e.g., resist state, partial pressure, temperature, focusing model), and/or any combination thereof; modeling and/or design of metrology systems; and modeling, design, and/or optimization of metrology targets;

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a metrology target design method comprising using OCD data related to at least one designed metrology target as an estimation of a discrepancy between a target model and a corresponding actual target on a wafer, and adjusting a metrology target design model to compensate for the estimated discrepancy.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
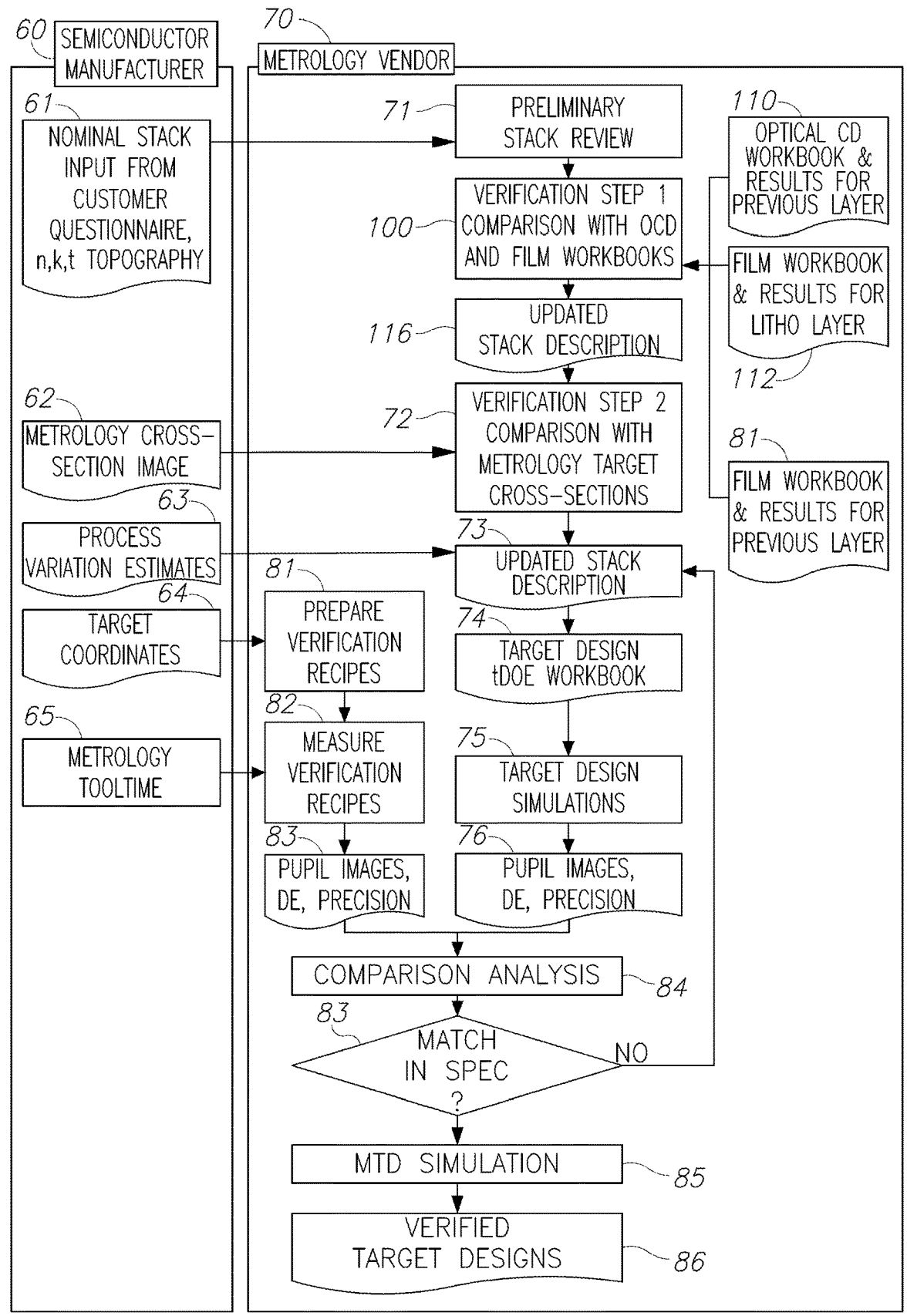
FIGS. 1 and 2 are high level flowcharts illustrating metrology workflows, according to some embodiments of the invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways. Also, it is to be understood that the phraseology and terminology employed herein is for the purpose of description and should not be regarded as limiting.

Metrology target design methods and verification targets are provided. Methods comprise using OCD data related to designed metrology target(s) as an estimation of a discrepancy between a target model and a corresponding actual target on a wafer, and adjusting a metrology target design model to compensate for the estimated discrepancy. The dedicated verification targets may comprise overlay target features and be size optimized to be measureable by an OCD sensor, to enable compensation for inaccuracies resulting from production process variation. Methods also comprise modifications to workflows between manufacturers and metrology vendors which provide enable higher fidelity metrology target design models and ultimately higher accuracy of metrology measurements.

Figure 2:
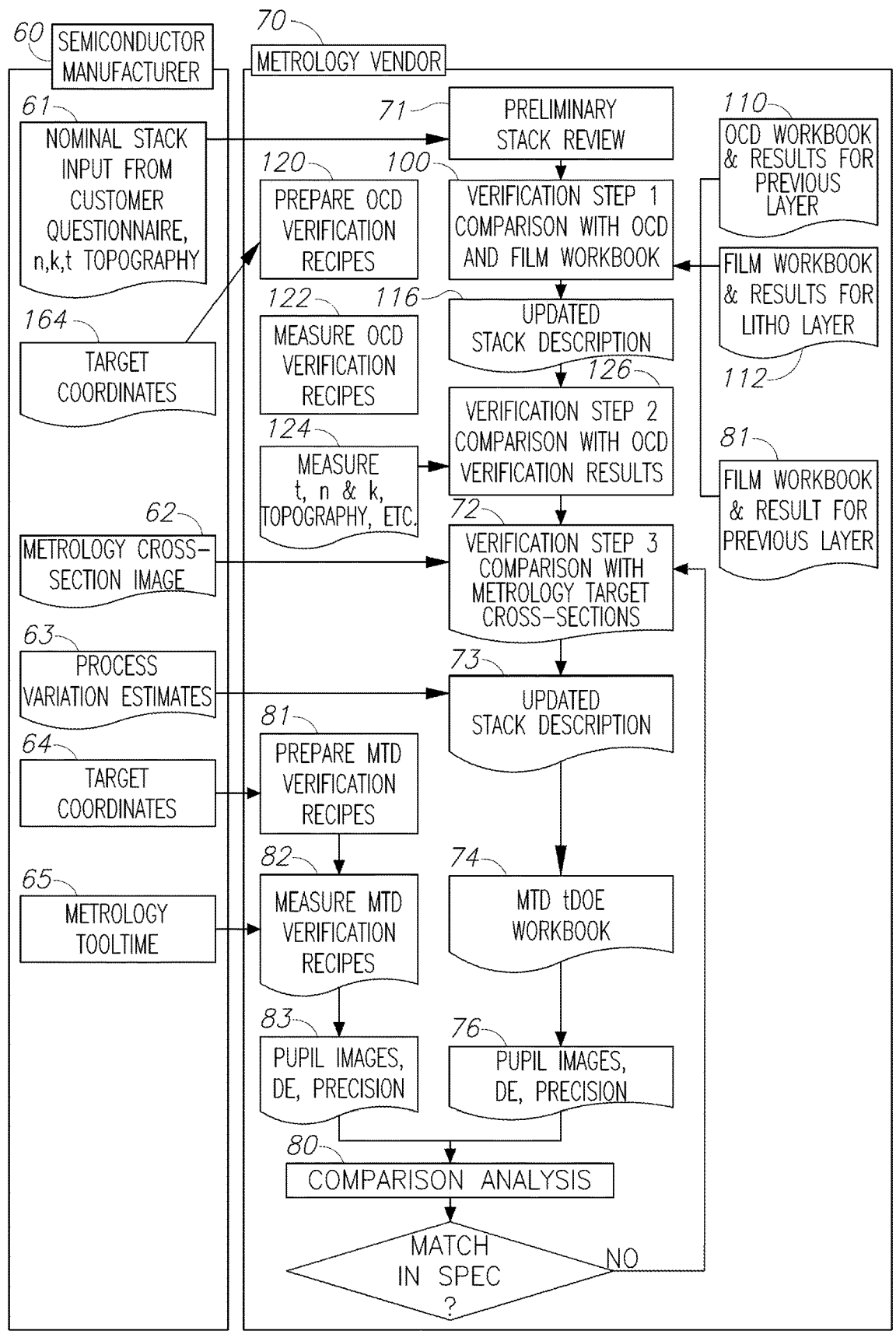

FIGS. 1 and 2 are high level flowcharts illustrating metrology workflows, according to some embodiments of the invention.

Metrology targets need to be designed in accordance with specific metrology performance requirements such as accuracy, precision and robustness. In order to enable these requirements simulations are often used in order to determine the relationship between the geometric characteristics of the target design and the resultant metrology performance as described e.g., in U.S. Pat. No. 8,214,771 which is incorporated herein by reference in its entirety. Typically, the simulation procedure begins with the insertion of a nominal stack and topography description of the semiconductor wafer in general and of the metrology target in particular.

The reliability of the simulation in predicting the metrology performance of a given metrology design is strongly influenced by the accuracy of the nominal stack and topography description. In the following, methods and target designs are presented, which enable improved accuracy in the prediction of metrology performance by verification of the stack and topography description. Parameters, such as target design characteristics, which may be verified using embodiments of the methods, include, but are not limited to the presence or absence or value of film stack thicknesses, film stack sequence, optical indices, e.g., the refractive indices (n) and extinction co-efficients (k), period, dispersion, duty cycle, critical dimension, critical dimension etch bias, induced topography, dishing due to over (or under) polish, side wall angles, asymmetry of side wall angles, layer planarity or lack thereof, LER (Line Edge Roughness), or any other topographic or optical characteristic which may impact metrology performance.

Certain embodiments of stack and topography verification sequences are shown in FIG. 1. Prior art workflow characteristically starts with nominal stack input from customer questionnaire 61, concerning, e.g., n, k and t (topography) parameters of the stack, and received from a semiconductor manufacturer 60. A metrology vendor 70 conducts a preliminary stack review 71, which is then verified 72 by comparison with metrology target cross section image(s) 62 provided by manufacturer 60. The stack description may be updated 73 upon receipt of process variation estimates 63, and target design (target design of experiment tDOE) workbook 74 is prepared, target design simulations 75 are run and pupil images, diffraction efficiency (DE), and precision data 76 are acquired. Target coordinates 64 and metrology tooltime 65 are received from manufacturer 60, metrology verification recipes are prepared 81, measured 82 and used to derive pupil images, DE, and precision data 83. The estimated and measured results 76, 83 respectively are compared 84 to evaluate the matching of the targets to the specification. In case of mismatch, stack description is updated again 73, new workbook(s), simulations and data are prepared, and simulations 85 are carried out, resulting in verified target designs 86.

In certain embodiments, an additional earlier verification step is added, namely a comparison with OCD (Optical Critical Dimension) and film workbooks 100, received e.g., from OCD workbook and results for previous layer(s) 110, film workbook and results for lithographic layer(s) 112 and/or film workbook and results for previous layer(s) 114, followed by an updated stack description 116 carried out possibly even before verification step 72 (concerning metrology target cross section 62). The OCD data used relates to designed metrology target(s) and provides an estimation of a discrepancy between device parameters and target parameters and/or an estimation of a discrepancy between designed target parameters and actual target parameters (of the targets as printed on the wafer). Updating 116 may adjust the respective metrology target design(s) to compensate for the estimated discrepancy.

The verification information (for step 100) may come from a number of difference sources including, but not restricted to metrology target cross sections such as cleaving or focused ion beam cross sections, SEM (scanning electron microscopy) and HR (high-resolution)-SEM images created from such cross-sections, optical CD (Critical Dimension) metrology performed either on the metrology target itself or on an additional proxy. These measurements may be made at various stages in the wafer manufacturing process. For example, they may be made immediately subsequent to lithographic processing of a first process layer, or subsequent to additional process steps such as etch, deposition or polish. In one embodiment the measurements are performed immediately prior to the second lithographic step so that the previous layer is fully processed and representative of the previous layer metrology structure, but the current layer has yet to be printed.

The stack and topography verification by OCD metrology can be done by several methods and may be divided between film and OCD due to different requirements for each measurement type. The fundamental aspect may be to measure the relevant stack for the OVL target due to the stack variation difference between the device and the target which is generally placed in scribe line areas and at feature sizes and pitches different from the device, which affect significantly the manufacturing process impact on the target topography. Film measurements may be carried out at an open area/zone near the target (e.g., an OVL, overlay, target) and/or specifically at a film pad (if such exists). The OCD or film measurements may be carried out at first on special target(s) that may contain the same pitches and geometrical design such as the (OVL) target itself, the target being in a specific size that fits the OCD or film tool requirements, for example several designs may be applicable, film only, grating over film, grating over grating and the next design may be the OVL target itself which may eliminate the source of error due to different measurement location. The OCD or film targets may have different spatial sizes, and may have various designed surrounding structures. The sampling of the film or OCD metrology may be at a single site on the field, on a single site on the wafer, or may be full field and wafer level sampling. More intensive spatial sampling of locations on the wafer, or wafers in a lot may also be used to quantify the process variation of said topographical parameters across the wafer or across the lot. The OCD metrology may be performed by various modeling methods, including regression and various algorithms (e.g., Levenberg-Marquet (L-M) and N2X solver). In certain embodiments, only a subset of the steps that are illustrated in FIG. 1 may be implemented, for example, verification 100 may enable omission of steps such as cross-section check 72, as there is already strong evidence that OCD may replace CD-SEM, and even achieve with better precision, and as OCD has the advantage of being non-destructive.

Certain embodiments of stack and topography verification sequences are shown in FIG. 2, including additional steps which specifically relate to the use of a verification target for the purpose of stack and topography verification. Verification target(s) may be configured to comprise overlay target features and be size-optimized to be measureable by an OCD sensor, and be measured to derive the used OCD data. Location(s), size(s) and a proximity(ies) to surrounding structures of the verification target(s) may be optimized to enhance the accuracy of the correction provided by their measurements.

Upon receipt of target coordinates 164 from manufacturer 60, metrology vendor 70 may prepare dedicated OCD or film verification recipes 120, measure the verification recipes 122 and use measured parameters (such as n, k, t etc.) in an additional verification step 126 to improve further the updated stack description 116 achieved above. Here too, only a subset of the steps may be implemented, for example, verification 100 may enable omission of steps such as cross-section check 72, as explained above.

Advantageously, while current simulation-based metrology target design is performed without stack and topography verification, resulting in potentially incorrect target geometry selection, the proposed model verification methodology enables matching between simulated and measured metrology performance to be achieved, resulting in more accurate target designs to be achieved on subsequent tape outs. This methodology may be the enabler for accurate metrology target design, which is a critical requirement for current generation metrology, specifically overlay metrology.

It is noted that the methodology may be applied to any metrology technique, any metrology tools and configurations, any light source and illumination configuration, any target types and target locations, any measurement configuration and methodology known in the art, some of which described in the background section above; and is not limited to the hardware, algorithm/software implementations and architectures, and use cases summarized above. Target characteristics may comprise any of: critical dimensions, overlay, sidewall angles, shape, stress, composition, films, film thicknesses, bandgap, electrical properties, process-related parameters (e.g., focus and/or dose), generating process parameters (e.g., resist state, partial pressure, temperature, focusing model as well as locations, sizes and surrounding structures.

Figure 3:
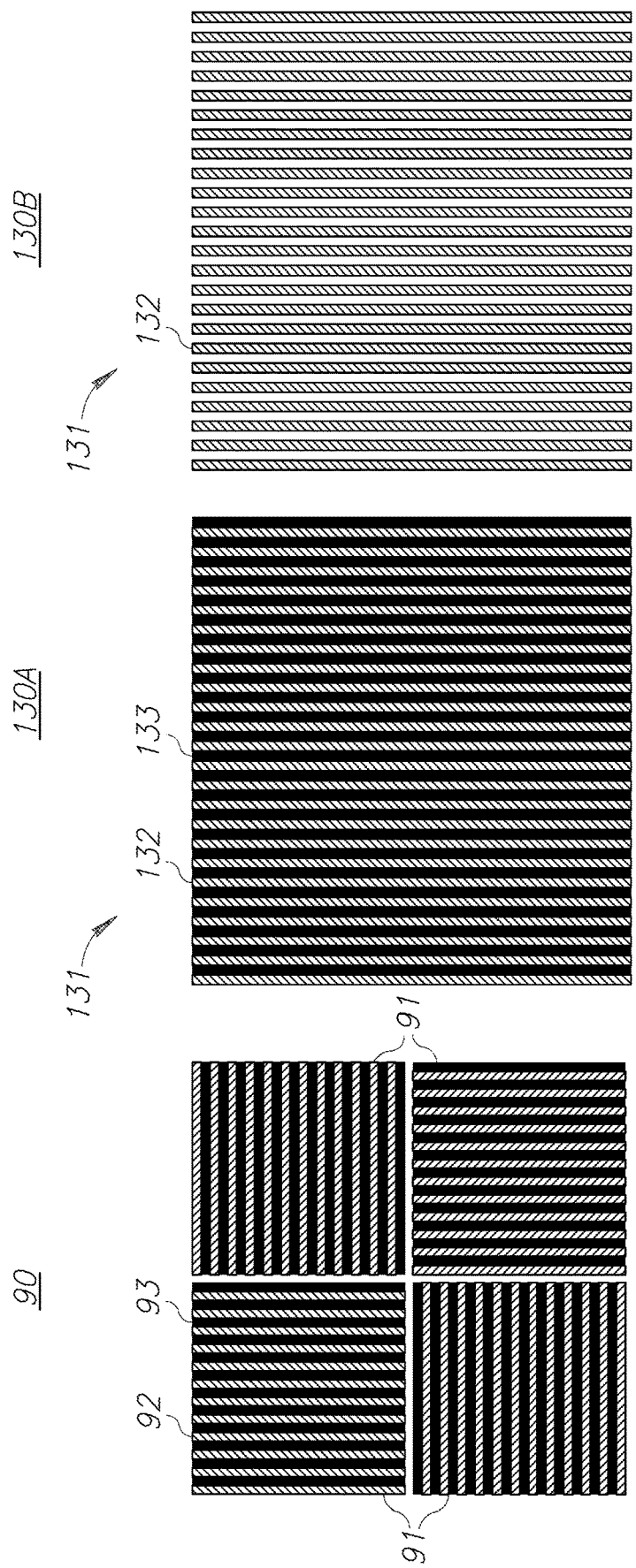
FIG. 3A is a high level schematic illustration of a prior art overlay metrology target.
FIGS. 3B and 3C are high level schematic illustrations of verification targets, according to some embodiments of the invention.

FIG. 3A is a high level schematic illustration of a prior art overlay metrology target 90. Overlay target 90 comprises four cells 91, each diagonal pair designed to provide overlay measurements in a different measurement direction (perpendicular x and y directions). Each cell 91 comprises a periodic structure 92 at a pervious (lower) layer and a periodic structure 93 at a current (upper) layer, with periodic structures 92, 93 being offset in opposite directions at the cells of each diagonal pair (e.g., the upper structure shifted at $+f_0$ and $-f_0$ with respect to the lower structure). It is noted that prior art overlay targets may comprise a different number of cells and layers, depending on its specific design. This is shown by way of example and it is appreciated that the metrology target could also be an imaging overlay, or a so-called side-by-side grating target (as opposed to a grating over grating metrology target illustrated in FIG. 3A).

FIGS. 3B and 3C are high level schematic illustrations of verification targets 130A, 130B, according to some embodiments of the invention. Verification targets 130A, 130B comprise a single cell 131 with at least one layer having overlay target features, such as periodic structures 132, 133. In the case of film measurements verification, the cell may contain the film stack only. Cell 131 has a cell side dimension of at least 10 μm, e.g., 10 μm, 15 μm, 30 μm, etc. and is size optimized so that it can be measured by an OCD sensor. Verification targets 130A may comprise at least two periodic structures 132, 133 that are identical in pitch and CD to periodic structures in one of the cells of a corresponding metrology target (such as periodic structures 92, 93 in cell 91 of overlay target 90). In certain embodiments, one of offsets $+f_0$ or $-f_0$ in target 90 may be designed between periodic structures 132, 133 in the corresponding verification target. For example, one of cells 91 in target 90 may be enlarged to dimensions that are measureable by an OCD sensor, to form verification targets such as verification targets 130A, 130B. The verification target may be designed and produced next to the corresponding overlay target. Verification targets 130B may consist a single periodic structure 132 that is identical in pitch and CD to a previous layer periodic structure of a corresponding metrology target (such as periodic structure 132 of overlay target 90). For example, single periodic structure 132 may be a previous layer of a corresponding overlay target, as explained above.

It is noted that in certain embodiments, the verification target(s) may comprise corresponding verification cell(s) having only the film stack, for performing film measurements verification.

Any of the verification targets may be designed and produced next to the corresponding metrology target and target design files may comprise a design of any of the verification targets next to a design of the corresponding metrology target. OCD measurements of any of the verification targets may be used in the disclosed methods and are considered part of the current invention.

The verification targets may comprise features, pitches and segmentations and/or topography which are nominally identical to those of a single cell in the overlay target. The size and/or layout of the overlay target may be selected to be measured on an overlay metrology sensor and the size and/or layout of the verification target may be selected to be measured on a CD metrology sensor. The verification targets may optionally be set next to the corresponding overlay targets and used for e.g., lot dispositioning and/or process control feedback.

Figure 4:
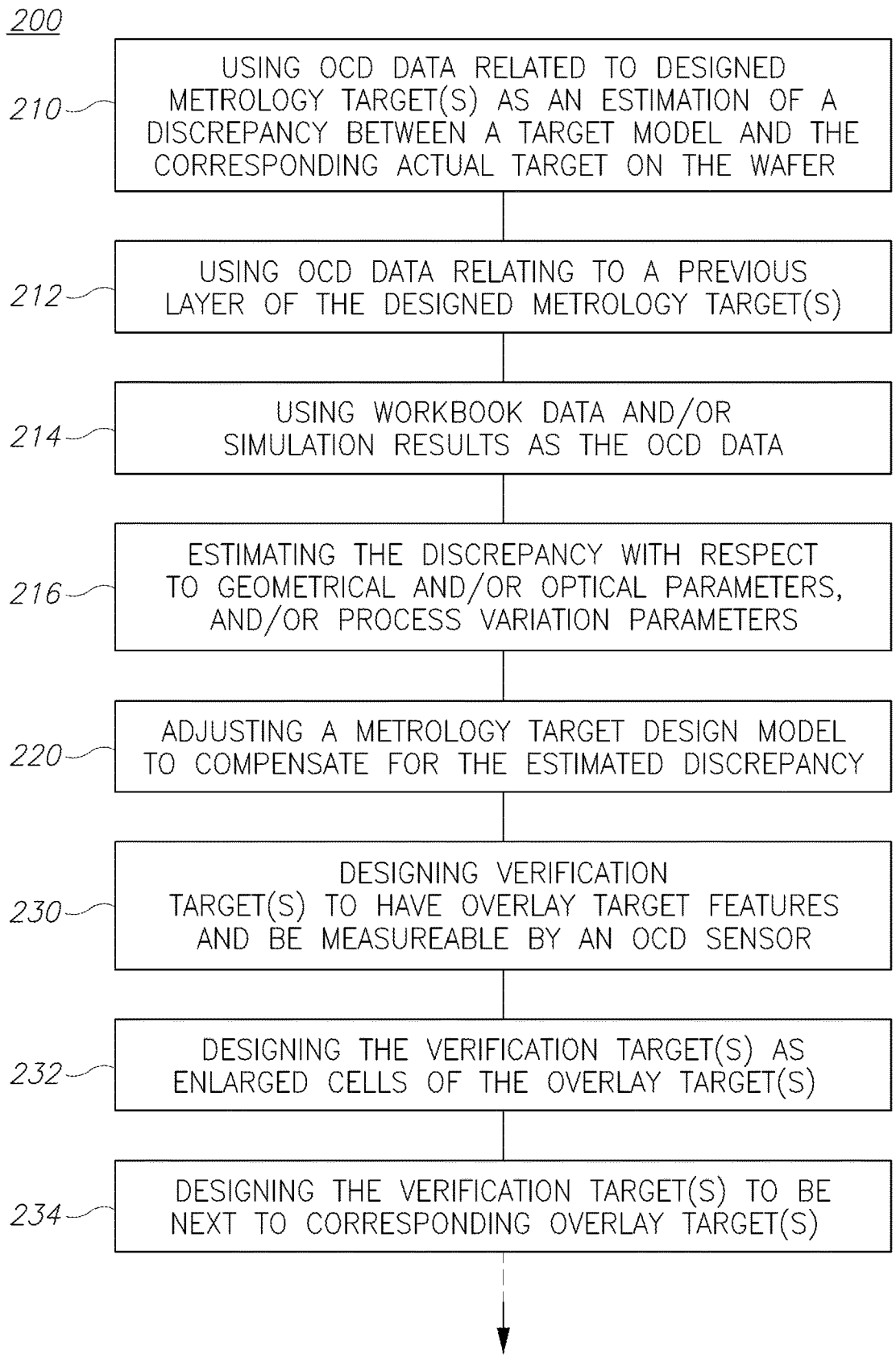
FIG. 4 is a high level schematic flowchart illustrating a target design method, according to some embodiments of the invention.

FIG. 4 is a high level flowchart illustrating a metrology target design method 200, according to some embodiments of the invention. Method 200 may be at least partially implemented by at least one computer processor, e.g., in a metrology target design module. Certain embodiments comprise computer program products comprising a computer readable storage medium having computer readable program embodied therewith and configured to carry out of the relevant stages of method 200. Certain embodiments comprise target design files of respective targets designed by embodiments of method 200.

Metrology target design method 200 may comprise using OCD data related to at least one designed metrology target as an estimation of a discrepancy between a target model and a corresponding actual target on a wafer (stage 210) and adjusting a metrology target design model to compensate for the estimated discrepancy (stage 220). In certain embodiments, the used OCD data may relate to a previous layer of the at least one designed metrology target (stage 212) and/or the used OCD data may comprises workbook data and/or simulation results (stage 214). Method 200 may comprise estimating the discrepancy with respect to geometrical and/or optical parameters, and/or process variation parameters (stage 216). For example, any of the following aspects of possible sources for discrepancies may be verified by method 200: one or more critical dimension(s), one or more optical material characteristic(s) such as refractive indices (n's) and extinction coefficients (k's), one or more film thickness(es), topography and presence of process variation, the latter relating to any of: induced topography, deposited topography, etched topography, and CMP (Chemical Mechanical Planarization) dishing; and may comprise symmetric and/or asymmetric process variation.

In certain embodiments, method 200 may further comprise designing at least one verification target configured to comprise overlay target features, and be size optimized to be measureable by an OCD sensor, e.g., have a cell side dimension of at least 10 μm, 15 μm, 30 μm, etc. (stage 230). For example, method 200 may comprise designing the verification target(s) as enlarged cells of the overlay target(s) (stage 232) and optionally designing the verification target (s) to be next to corresponding overlay target(s) (stage 234). The at least one verification target may be designed to be next to the at least one overlay metrology target. In certain embodiments, method 200 may comprise using, for film measurements verification, a verification cell having only the film stack (stage 236).

Method 200 may further comprise measuring the at least one verification target by an OCD sensor, e.g., by optical or SEM CD metrology, to derive the used OCD data (stage 240). In certain embodiments, designed features of the verification target(s) may comprise at least one of: one or more pitch(es), one or more segmentation(s) and one or more topography(ies) which are nominally identical to corresponding feature(s) of at least one overlay metrology target as the designed metrology target(s).

In certain embodiments, method 200 may further comprise optimizing at least one of: a location, a size and a proximity to surrounding structures of the at least one verification target (stage 250).

In certain embodiments, method 200 may further comprise improving a match between measurement and simulation of overlay target(s) by using the measurement of verification target(s) designed using elements of the overlay target(s) which are used to perform overlay metrology (stage 260). Method 200 may further comprise improving a design of subsequently printed metrology targets using the improved match (stage 262).

In certain embodiments, method 200 may further comprise optimizing a metrology recipe setup of overlay measurements of overlay target(s) by using the measurement of verification target(s) designed using elements of the overlay target(s) (stage 270), e.g., by feedforwarding information to a simulation system and/or to a respective metrology system or tool. For example, optimizing the metrology recipe setup may be carried out with respect to any of: metrology accuracy, precision and/or robustness, and/or combinations thereof (stage 272). In certain embodiments, the simulation system may be used to design metrology targets in accordance with the method described in U.S. Pat. No. 8,214,771, which is incorporated herein by reference in its entirety.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A metrology target design method comprising:
using optical critical dimension data related to at least one designed overlay metrology target as an estimation of a discrepancy between a target model and a corresponding actual target on a wafer, wherein the optical critical dimension data is at least partially derived from a measurement, with a critical dimension metrology sensor, of at least one verification target comprising one or more overlay target features, wherein the one or more overlay target features of the at least one verification target comprise at least one of: a pitch, a segmentation and a topography which is identical to a corresponding feature of at least one overlay metrology target as the at least one designed overlay metrology target; and
adjusting a metrology target design model to compensate for the discrepancy, wherein the adjusting is carried out with respect to at least one of a critical dimension, an optical material characteristic, a film thickness, topography or presence of process variation, wherein the process variation relates to at least one of an induced topography, a deposited topography, an etched topography, or chemical mechanical planarization dishing.

2. A verification metrology target comprising:
a single cell with at least one layer having overlay target features, wherein the single cell has a cell side dimension of at least 10 μm, wherein optical critical dimension data is derivable from a measurement, with a critical dimension metrology sensor, of the overlay target features of the single cell, wherein one or more overlay target features comprise at least one of: a pitch, a segmentation and a topography which is identical to a corresponding feature of at least one overlay metrology target as the at least one designed overlay metrology target.

3. The verification metrology target of claim 2, wherein the single cell comprises:
a single periodic structure that is identical in a pitch and a CD to a previous layer periodic structure of a corresponding metrology target.

4. The verification metrology target of claim 2, wherein the single cell comprises:
at least two periodic structures that are identical in a pitch and a CD to periodic structures in one of the cells of a corresponding metrology target.

5. The verification metrology target of claim 2, wherein the verification metrology target is designed and produced next to the corresponding metrology target.

6. A metrology target design method comprising:
using film data related to at least one designed overlay metrology target as an estimation of a discrepancy between a target model and a corresponding actual target on a wafer, wherein the film data is at least partially derived from a measurement, with a critical dimension metrology sensor, of at least one verification target comprising a film stack which is identical to a corresponding feature of the target model; and
adjusting a metrology target design model to compensate for the discrepancy.

7. The method of claim 6, wherein the adjusting is carried out with respect to at least one of: a critical dimension, an optical material characteristic, a film thickness, a topography, or a presence of process variation.

8. The method of claim 7, wherein the process variation relates to at least one of: an induced topography, a deposited topography, an etched topography, or chemical mechanical planarization dishing.

9. The method of claim 8, wherein the process variation comprises symmetric and/or asymmetric process variation.

10. The method of claim 6, wherein the film data relates to a previous layer of the at least one designed overlay metrology target.

11. The method of claim 6, wherein the film data comprises at least one of workbook data or simulation results.

12. The method of claim 6, wherein the at least one verification target comprises overlay target features, wherein the method further comprises: measuring the at least one verification target with an OCD sensor to derive the film data.

13. The method of claim 12, further comprising:
optimizing at least one of: a location, a size or a proximity to surrounding structures of the at least one verification target.

14. The method of claim 13, wherein the measuring is carried out by optical or SEM CD metrology.

15. The method of claim 13, wherein the overlay target features of the at least one verification target comprise at least one of: a pitch, a segmentation and a topography which is identical to a corresponding feature of at least one overlay metrology target as the at least one designed overlay metrology target.

16. The method of claim 6, further comprising:
improving a match between measurement and simulation of the at least one overlay target by using a measurement of the at least one verification target.

17. The method of claim 16, further comprising:
improving a design of subsequently printed metrology targets using the match.

18. The method of claim 6, further comprising:
optimizing a metrology recipe setup of overlay measurements of the at least one overlay metrology target, by using a measurement of the at least one verification target.

19. The method of claim 18, wherein the optimization is carried out with respect to at least one of: a metrology accuracy, a metrology precision, a metrology robustness, or a combination thereof.

* * * * *